United States Patent
Sato

(10) Patent No.: US 6,917,543 B2
(45) Date of Patent: Jul. 12, 2005

(54) FLASH MEMORY FOR IMPROVING WRITE ACCESS TIME

(75) Inventor: Akira Sato, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 122 days.

(21) Appl. No.: 10/650,665

(22) Filed: Aug. 29, 2003

(65) Prior Publication Data

US 2004/0042284 A1 Mar. 4, 2004

(30) Foreign Application Priority Data

Aug. 30, 2002 (JP) ....................................... 2002-253396

(51) Int. Cl.[7] .............................................. G11C 16/06
(52) U.S. Cl. .......................... 365/185.22; 365/185.05; 365/230.08; 365/189.07; 365/239.03
(58) Field of Search ....................... 365/185.22, 189.05, 365/230.08, 189.07, 230.03

(56) References Cited

U.S. PATENT DOCUMENTS 5,787,039 A * 7/1998 Chen et al. ............ 365/185.22
6,751,118 B2 * 6/2004 Tran et al. ............. 365/185.03

FOREIGN PATENT DOCUMENTS

| JP | 61-122770 | 6/1986 |
|---|---|---|
| JP | 6-20487 | 1/1994 |
| JP | 2000-276883 | 10/2000 |
| JP | 2000-285092 | 10/2000 |
| JP | 2000-285686 | 10/2000 |

* cited by examiner

Primary Examiner—Anh Phung
Assistant Examiner—Tuan T. Nguyen
(74) Attorney, Agent, or Firm—Dickstein, Shapiro, Morin & Oshinsky, L.L.P

(57) ABSTRACT

A flash memory including a flash memory cell array, a page buffer, a comparator circuit, and a verify flag buffer. The flash memory cell array includes a plurality of blocks. The page buffer temporarily stores therein write data received from an external system. The page buffer includes pages. The comparator circuit executes pre-verification through comparing data stored in the page buffer with data stored in addressed one of the blocks. The verify flag buffer stores therein verify flags respectively associated with the pages. Each of the verify flags is switched in response to update of associated one of the pages. The comparator circuit executes pre-verification with respect to one of the pages, the one being associated with unswitched one of the verify flags, while skipping pre-verification with respect to another of the pages associated with the switched one of the verify flags.

5 Claims, 9 Drawing Sheets

Fig. 2 PRIOR ART

| INPUT | | OUTPUT | |
|---|---|---|---|
| DATA BIT RECEIVED FROM PAGE BUFFER 4 | DATA BIT RECEIVED FROM SENSE AMPLIFIER 6 | ASSOCIATED BIT OF WRITE ENABLE SIGNAL 21 | ASSOCIATED BIT OF WRITE ERROR DETECTION SIGNAL 20 |
| 0 | 0 | 0 | 0 |
| 0 | 1 | 1 | 0 |
| 1 | 0 | 0 | 1 |
| 1 | 1 | 0 | 0 |

Fig. 5

| DW | W | I/O MODE |
|---|---|---|
| 1 | 1 | 32-BIT DATA INPUT MODE |
| 0 | 1 | 16-BIT DATA INPUT MODE |
| - | 0 | 8-BIT DATA INPUT MODE |

VERIFICATION: 0.2 μs × 33

PROGRAMMING: 10 μs × 1

⇩

16.6 μs

VERIFICATION: 0.2 μs × 2

PROGRAMMING: 10 μs × 1

⇩

10.4 μs

FLASH MEMORY FOR IMPROVING WRITE ACCESS TIME

BACKGROUND OF THE INVENTION

1. Field of the Invention

The present invention is related, in general, to flash memories, in particular, to an improvement of write access time of flash memories.

2. Description of the Related Art

One of the issues of flash memories is long write access time. The long write access time of flash memories often restricts the use of the flash memories.

In order to reduce write access time, build-in page buffer architecture has been developed. A typical build-in page buffer flash memory includes a static random access memory (SRAM), which has a fast read/write access time, as a page buffer. Write data is temporarily stored in the SRAM-based page buffer, and then transferred from the page buffer to the flash memory array.

FIG. 1 is a block diagram of a typical build-in page buffer flash memory. The conventional flash memory is composed of an address buffer 1, an I/O buffer 2, a page buffer 4, a comparator circuit 85, a sense amplifier 6, a write amplifier 7, a memory cell array 8, a row decoder 9, a column decoder 10, an internal address generator 11, and a sequence control circuit 92.

The address buffer 1 receives an address signal indicative of a write address from an external system, and generates a page address and a column address in response to the address signal. The page address consists of a part of the write address, and the column address is another part of the received write address.

The I/O buffer 2 provides an interface to achieve exchange of data between the page buffer 4 and the external system. The I/O buffer 2 receives write data from the external system, and outputs read data received from the memory cell array 8.

The memory cell array 8 includes flash memory cells arranged in rows and columns. The memory area of the memory cell array 8 is divided into a plurality of blocks addressable by the write address. Erasing data within the memory cell array 8 is executed in units of blocks.

The page buffer 4 is used to temporarily store the write data received through the I/O buffer 2. The size of the page buffer 4 is the same as the block size, which is typically 1024 bits. The memory area of the page buffer 4 is divided into 32 pages, each of which consists of 32 bits. The pages of the page buffer 4 are addressable by the page address received from the address buffer 1.

The sense amplifier 6 obtains 32-bit data from the addressed block of the memory cell array 8, and outputs the obtained 32-bit data to the comparator circuit 85.

The comparator circuit 85 receives 32-bit data from the page buffer 4, and compares the data received from the page buffer 4 with the data received from the memory cell array 8 to generate a write enable signal 21 and a write error detection signal 20. The write enable signal 21 is representative of whether the requested data write requires programming flash memory cells, and the write error detection signal 20 is representative of whether the requested data write is invalid.

The comparator circuit 85 is used for pre-verification and post-verification of data within the page buffer 4. The pre-verification of the data within the page buffer 4 designates the data verification executed before data write for determining the necessity and validity of the data write of the data within the page buffer 4 into the memory cell array 8. The pre-verification involves comparing the data stored in the page buffer 4 with the data stored in the addressed block, which is selected by the write address as the destination of the data write. The post-verification designates data verification of the write data after the write operation for ensuring that the data write is successfully completed.

The comparator circuit 85 includes 32 comparators, each of which receives one of the data bits from the page buffer 4 and the associated one of the data bits from the sense amplifier 6. FIG. 2 shows a truth table describing operations of the comparators within the comparator circuit 85. Each signal bit of the write enable signal 21 is activated (or set to logic "1") when the associated one of the data bits from page buffer 4 is logic "0", and the associated one from the sense amplifier 6 is logic "1"; otherwise the signal bit of the write enable signal 21 is deactivated (or set to logic "0"). On the other hand, each signal bit of the write error detection signal 20 is activated when the associated one of the data bits from page buffer 104 is logic "0", and the associated one from the sense amplifier 106 is logic "1"; otherwise the signal bit of the write error detection signal 20 is deactivated.

The write amplifier 7 writes the 32-bit data received from the page buffer 4 into the memory cell array 8 through the row decoder 9.

The row decoder 9 selects a row of the memory cells to be accessed in response to an internal address generated by the internal address generator 11.

The column decoder 10 selects a column of the memory cells to be accessed in response to the column address received from the address buffer 1.

The internal address generator 11 generates and provides the internal address for the row decoder 9 and the page buffer 4 under the control of the sequence control circuit 92. The internal address generator 11 increments the internal address by one in response to a control signal received from the sequence control circuit 92.

The sequence control circuit 92 controls the write operation in response to the write error detection signal 20 and the write enable signal 21. The sequence control circuit 92 quits the write operation when any signal bit of the write error detection signal 20 is activated during pre-verification. In addition, the sequence control circuit 92 monitors the write enable signal 21, and disables the data write of the data within the selected page of the page buffer 4 when the data within the selected page is identical to the data within the addressed location in the memory cell array 8, which is selected as the destination of the data write.

As described, a write operation of flash memories requires pre-verification of the write data. One of the reasons is the unidirectional data write operation of the flash memories as described below. The architecture of the flash memory allows programming memory cells independently (that is, allows setting respective memory cells to logic "0" independently); however, the architecture requires erasing memory cells in units of blocks. Therefore, writing logic "1" into a memory cell requires erasure of the whole block including the memory cell. It should be noted that an erased memory cell represents logic "1" while a programmed memory cell represents logic "0". In other word, data write involving writing logic "1" in a single memory cell is not allowable. Therefore, the validity of a requested data write must be determined before the requested data write is executed.

Another reason is the limited erase/rewrite life of flash memory cells. An unnecessary rewrite operation is preferably avoided for improving the erase/rewrite life of flash memory cells. Therefore, when the data to be written in a memory cell is identical to the data already stored in the memory cell, the data write to the memory cell should be quit.

FIG. 3 shows a typical procedure of a write operation of flash memories. The procedure begins with an input of a page write command. In response to the page write command, the page buffer 4 is initialized to set all the data bits of the page buffer 4 to logic "1" at Step 101. At Step 102, a write address and write data are then received by the address buffer 1 and I/O buffer 2, respectively. The page buffer 4 is addressed by the page address, and the write data is written into the addressed location of the page buffer 4. The memory cell array 8 are also addressed by the write address, and one of the blocks of the memory cell array 8 is selected as the addressed location of the data write.

Pre-verification is then executed by the comparator 85 at Step 103 to determine the necessity and validity of the data write by comparing the data within the page buffer 4 with the data within the addressed block.

In response to the result of the pre-verification, programming of the memory cell array 8 is then executed at Step 104 to write the write data, which is temporary stored in the page buffer 4, into the memory cell array 8. When the write data is identical to the data within the addressed location of the memory cell array 8, the data write is cancelled. When the write data includes one or more bits which require flip of data from logic "0" to logic "1" within the addressed block of the memory cell array 8, the write data is programmed into the addressed block after the addressed block is erased; otherwise, the write data is programmed without erasing the addressed block.

Finally, post-verification is executed at Step 105 to confirm that the write data is correctly written into the addressed block of the memory cell array 8 by comparing the data stored in the addressed block with the data stored in the page buffer 4.

Various built-in page buffer flash memories are disclosed in various document; Japanese Open Laid Patent Application No. 2000-285686 discloses a built-in page buffer flash memory for avoiding incorrect data write. This flash memory includes a flag circuit which stores therein flags, each of which is associated with a byte of data stored in the page buffer. The activation of the each flag represents that the associated byte in the page buffer is rewritten or updated during write operation. After all the flag are activated, the write data is transferred from the page buffer to the memory cell array. This ensures that the page buffer correctly receives the write data, and thus effectively avoids incorrect data write.

Japanese Open Laid Patent Application No. Heisei 6-20487 discloses a built-in page buffer flash memory for avoiding incorrect data write and reducing a number of data rewrite. In this flash memory, the memory cell array includes blocks, each of which consists of a plurality of pages arranged in a row extending in a direction from the sources to drains of the flash memory cells. The page buffer includes a plurality of addressable pages associated with the pages within the each block. The data write is sequentially executed from the page positioned at the source side end to the page positioned at the drain side end, regardless of the order of the data write into the pages of the page buffer. The data write from the page positioned at the source side end effectively avoids incorrect data write, and thus reduces a number of data rewrite after the incorrect data write.

Japanese Open Laid Patent Application No. 2000-276883 discloses a flash memory for reducing write access time. The disclosed flash memory includes a control circuit which controls the data write sequence in response to commands selectively requesting programming the whole addressed block or programming part of the addressed block.

Japanese Open Laid Patent Application No. 2000-285092 discloses a flash memory in which erasing and programming are independently executed in response to separate commands. Erasing an addressed block is executed in response to an erase command, while programming an addressed block is executed in response to a program command.

Japanese Open Laid Patent Application No. Showa 61-122770 discloses a memory access controller for achieving fast serial data transfer between a memory device and peripheral devices. This memory access controller includes an initial memory address register for providing an initial memory address, and an address counter which generates a memory address by incrementing the memory address from the initial memory address. The address counter basically increments the memory address by one, and increases the memory address by two or more when the increment of the memory address reaches a predetermined value.

Although pre-verification is inevitable for flash memories, the pre-verification undesirably increases write access time of the flash memories. For example, the flash memory disclosed in FIG. 1 requires 32 data verification cycles to complete the pre-verification, because the page buffer 4 includes 32 pages and the comparator circuit 83 compares the data from the page buffer 4 and the memory cell array 8 in units of pages. Executing repeated data verifications undesirably increases the write access time.

In fact, the pre-verification is not necessary with respect to all the pages of the page buffer 4. Data write usually involves updating some, not all, of the pages within the page buffer 4. The pre-verification is necessary for only updated pages of the page buffer 4.

SUMMARY OF THE INVENTION

In summary, the present invention addresses an improvement in write access time of flash memories.

In detail, an object of the present invention is to provide a flash memory for reducing necessary time for pre-verification to achieve improved write access time.

In an aspect of the present invention, a flash memory is composed of a flash memory cell, a page buffer, a comparator circuit, and a verify flag buffer. The flash memory cell array includes a plurality of blocks. The page buffer temporarily stores therein write data received from an external system, and includes a plurality of pages. The comparator circuit is provided to execute pre-verification through comparing data stored in the page buffer with data stored in addressed one of the plurality of blocks. The verify flag buffer stores therein a plurality of verify flags respectively associated with the plurality of pages. Each of the plurality of verify flags is switched in response to update of associated one of the plurality of pages. The comparator circuit executes pre-verification with respect to one of the pages, the one being associated with unswitched one of the verify flags, while skipping pre-verification with respect to another of the pages associated with the switched one of the verify flags.

This architecture avoids unnecessary data verification of an unupdated page(s), and thus effectively reduces write access time.

Preferably, each of the pages within the page buffer includes a plurality of data sectors, and the flash memory further includes a write history flag buffer storing therein a plurality of write history flags respectively associated with plurality of the data sectors, each of the plurality of write history flags being switched in response to rewrite of associated one of the plurality of pages. In this case, the comparator circuit preferably executes pre-verification with respect to one of the data sectors associated with unswitched one of write history flags, while skipping pre-verification with respect to another of the data sectors associated with the switched one of the write history flags.

The page buffer, and the write history buffer are advantageously integrated in a same memory cell array.

In another aspect of the present invention, a method is composed of:

providing a flash memory which includes a flash memory cell array having a plurality of blocks, a page buffer including a plurality of pages, and a verify flag buffer storing therein a plurality of verify flags respectively associated with the pages;

storing write data into a page buffer including a plurality of pages;

switching one(s) of the plurality of verify flags in response to update of associated one(s) of the plurality of pages during the storing; and executing pre-verification through comparing data within the page buffer with data stored in addressed one of the plurality of blocks. The execution of the pre-verification includes:

executing pre-verification with respect to one of the pages, the one being associated with unswitched one of the plurality of verify flags, and skipping pre-verification with respect to another of the pages associated with the switched one of the verify flags.

Preferably, each of the pages includes a plurality of data sectors, and the flash memory further includes a write history flag buffer storing therein a plurality of write history flags respectively associated with the data sectors. In this case, the method is preferably further composed of:

switching one(s) of the plurality of write history flags in response to update of associated one(s) of the plurality of data sectors during the storing, and wherein the executing pre-verification with respect to the one of the pages includes:

executing pre-verification with respect to one of the data sectors associated with unswitched one of the plurality of write history flags, skipping pre-verification with respect to another of the data sectors associated with the switched one of the write history flags.

BRIEF DESCRIPTION OF THE DRAWINGS

FIG. 2 is a truth table describing an operation of comparator circuit 85;

FIG. 5 is a table describing an association of mode setting an association of a selected I/O mode to the states of mode setting signals DW and W;

DESCRIPTION OF THE PREFERRED EMBODIMENTS

Preferred embodiments of the present invention are described below in detail with reference to the attached drawings.

Figure 4:
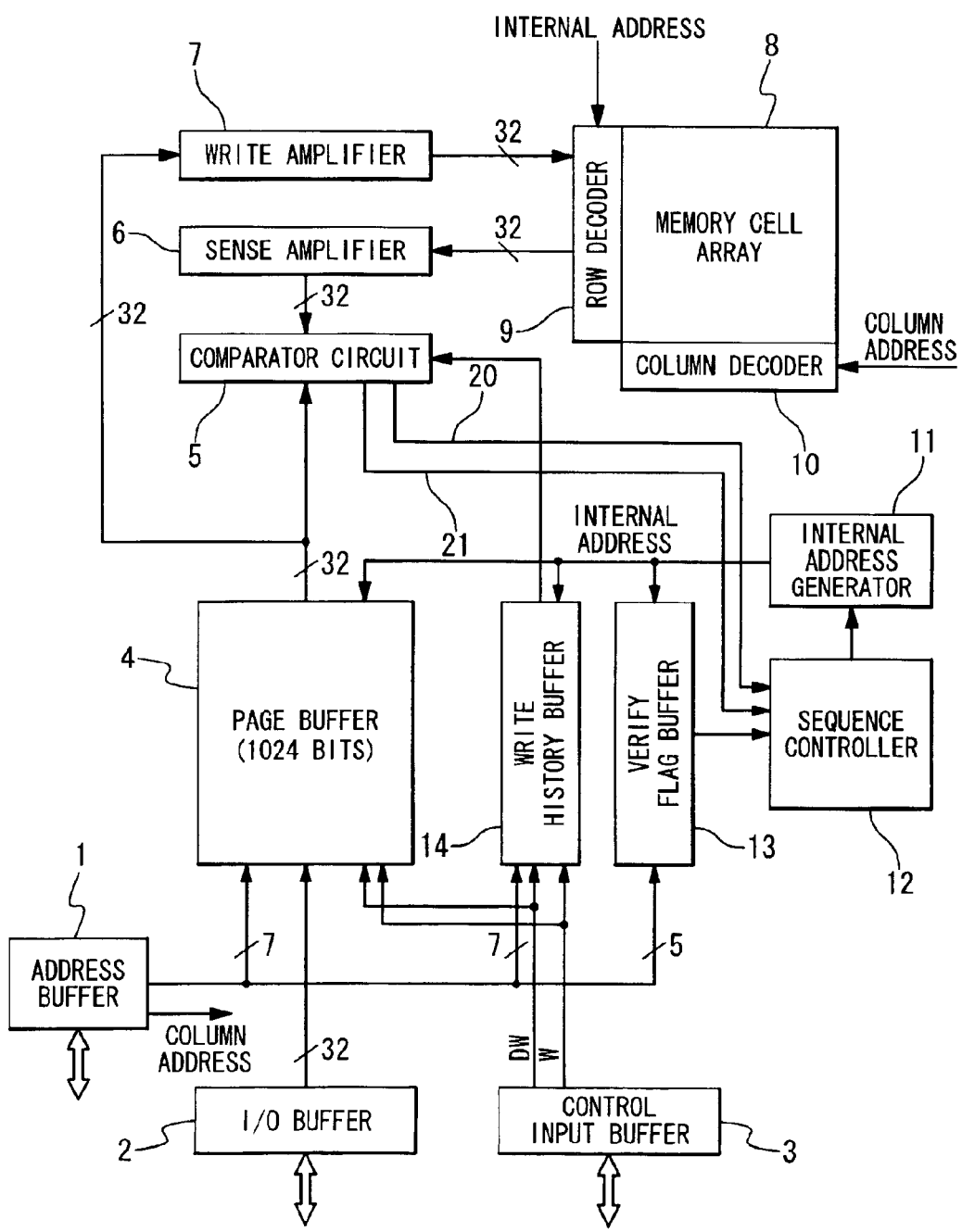
FIG. 4 is a block diagram of a flash memory in accordance with the present invention.

FIG. 4 is a block diagram of a flash memory in one embodiment according to the present invention. In FIG. 4, elements corresponding to those illustrated in FIG. 1 are denoted by the same numerals, and detailed explanations thereof are not given below to avoid repeated explanations.

Figure 1:
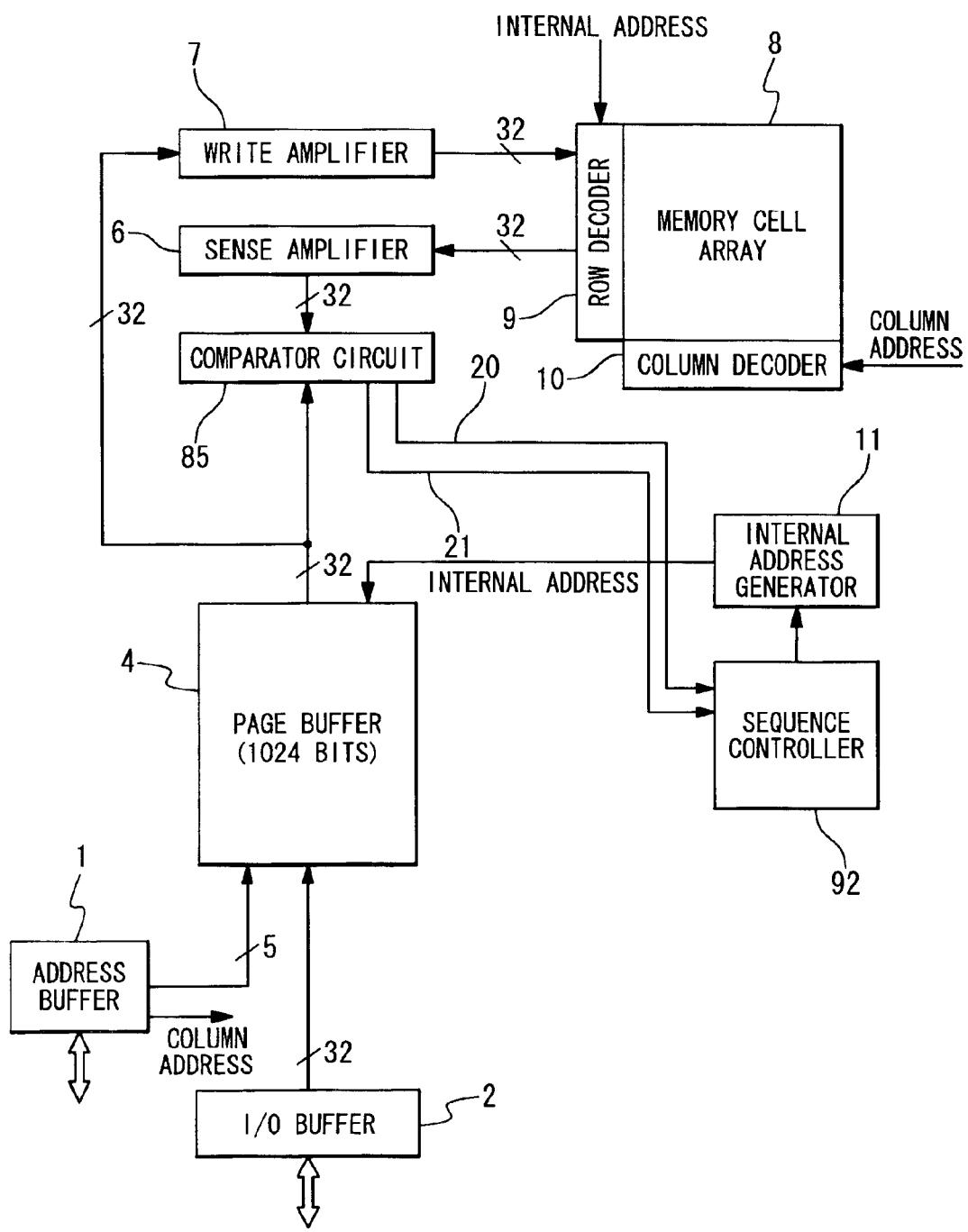
FIG. 1 is a block diagram of a typical conventional flash memory.
Figure 3:
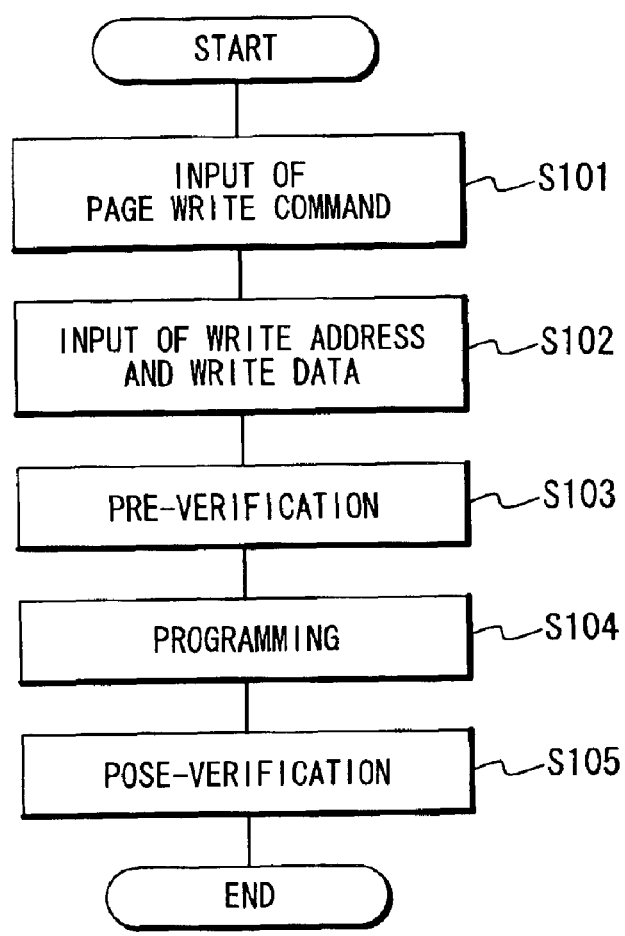
FIG. 3 is a flowchart illustrating operations of the conventional flash memory.

The memory system structure of the flash memory in this embodiment is similar to that of the flash memory illustrated in FIG. 1, except for that the comparator circuit 85 and the sequence controller 92 are respectively replaced with a comparator circuit 5 and a sequence controller 12, and that a control input buffer 3, a verify flag buffer 13 and a write history flag buffer 14 are added to the flash memory.

The control input buffer 3 generates a pair of mode setting signals DW and W to allow the flash memory to be placed into a selected I/O mode in response to control signals from an external system. The I/O mode includes a 32-bit data input mode, a 16-bit data input mode, and a 8-bit data input mode. The 32-bit data input mode designates an I/O mode in which 32 data bits are inputted to the I/O buffer 2 at one time, the 16-bit data input mode designates an I/O mode in which 16 data bits are inputted at one time, and the 8-bit data input mode designates an I/O mode in which 8 data bits are inputted at one time.

The architecture thus-described allows a user to select a preferable input data width. A user system may deal with 8-bit data, 16-bit data, or 32-bit data. The flexible data width allows the flash memory to adapt the user system's data configuration.

FIG. 5 shows an association of the selected I/O mode to the states of the mode setting signals DW and W. Both of the mode setting signal DW and W are set to logic "1" to place the flash memory into the 32-bit data input mode. The mode setting signal DW and W are respectively set to logic "0" and logic "1" to place the flash memory into the 16-bit data input mode. And the mode setting signal W is set to logic "0" to place the flash memory into the 8-bit data input mode. The symbol "-" represents "don't care", that is, the mode setting signal DW may be logic "0" or logic In this embodiment, the page buffer 4 includes 32 pages, each of which stores therein 32-bit data. Each of the pages is composed of four data sectors, each of which stores therein 8-bit data. The pages of the page buffer 4 is addressed by a 5-bit page address, which is a part of the write address received by the address buffer 1, and the data sectors are addressed by a 2-bit sector address, which is another part of the write address.

The verify flag buffer 13 stores therein verify flags respectively associated with each page of the page buffer 4. The number of the verify flags is equal to that of the pages of the page buffer 4. In this embodiment, the number of the verify flags is 32, because the page buffer 4 includes 32 pages.

Each verify flag indicates the necessity of pre-verification of the page associated therewith. The verify flags are initially deactivated, that is, set to logic "0". When write operation is initiated, the verify flag buffer 13 receives the page address from the address buffer 1 to address the verify flags. When addressed one of the pages of the page buffer 4 is accessed and updated, the verify flag associated with the addressed page is activated, that is, switched from logic "0" to logic "1" in response to the page address.

The write history buffer 14 stored therein write history flags respectively associated with each data sector. In this embodiment, the number of the write history flags is 128 (=32×4), because the page buffer 4 includes 32 pages, and each page include four data sectors. The write history flags is addressed by the 5-bit page address and the 2-bit sector address received from the address buffer 1.

The activation of the write history flags represents that the associated data sectors are updated during write operation, while the deactivation represents that the associated data sectors are not updated. The write history flags are initially activated, that is, set to logic "1". When addressed one of the data sectors is rewritten or updated, the write history flag associated with the addressed data sector is deactivated, that is, switched from logic "1" to logic "0", in response to the page address and the sector address.

The function of the sequence controller 12 is almost identical to that of the sequence controller 92 in the FIG. 1, except for that the sequence controller 12 is operated so as to prohibit the pre-verification of the pages in response to the verify flags within the verify flag buffer 13. When the verify flag associated with the addressed page of the page buffer 4 is deactivated, the sequence controller 12 outputs a control signal to cause the internal address generator 11 to increment the internal address before the pre-verification of the addressed page is started. This results in that the pre-verification with respect to the addressed page is omitted or skipped when the addressed page is not updated. Otherwise, in response to the verify flag associated with the addressed page being activated, the sequence controller 12 outputs a control signal to cause the internal address generator 11 to increment the internal address after the pre-verification of the addressed page is completed. In detail, the sequence controller 12 increments the internal address, a certain duration (typically 200 ns) after the previous increment of the internal address, the duration being determined so that the pre-verification is completed.

Figure 6:
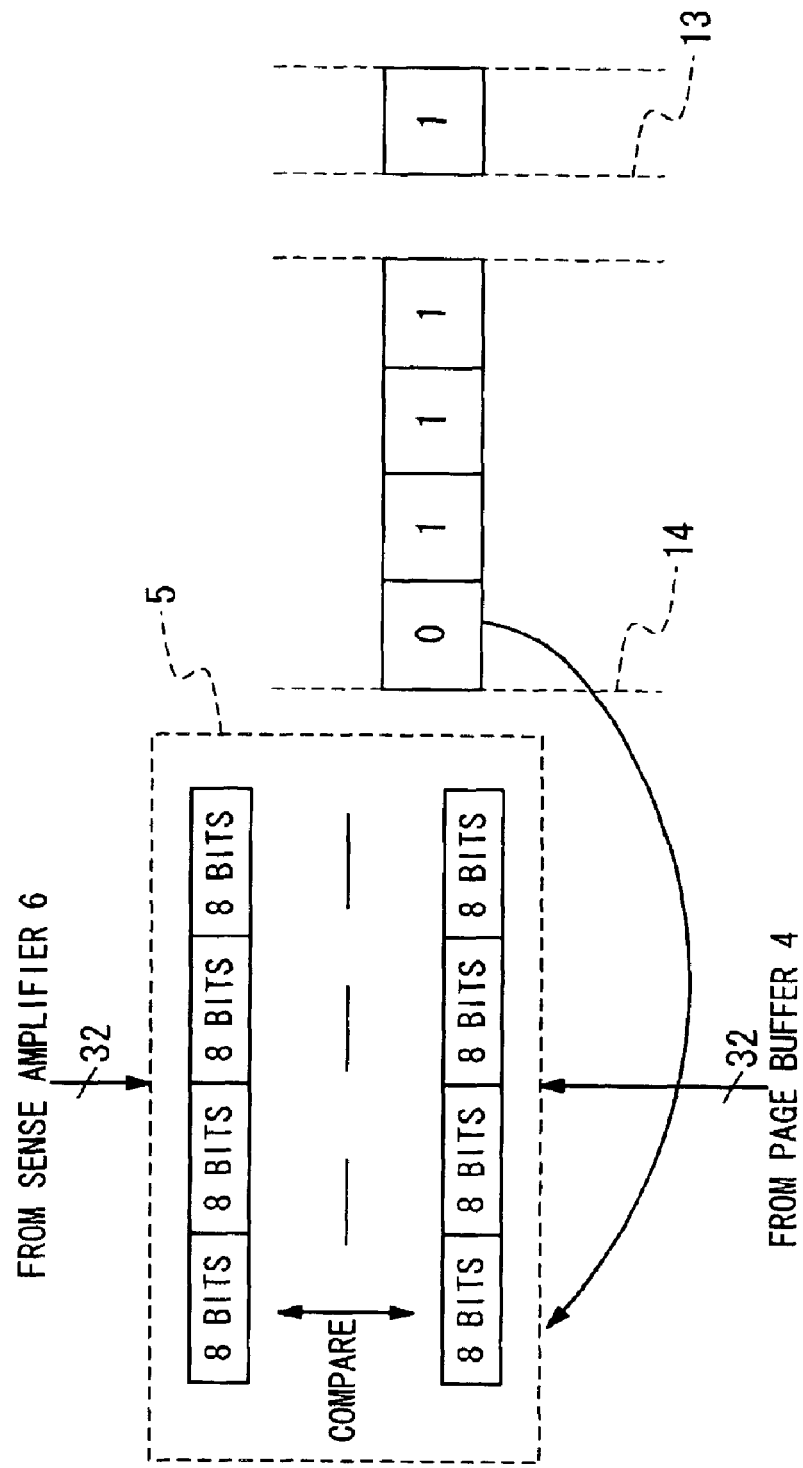
FIG. 6 illustrates pre-verification of a page in response to write history flags.

The function of the comparator circuit 5 in this embodiment is almost identical to that of the comparator circuit 85, except for that the comparator circuit 5 is responsive to the write history flags within the write history flag buffer 14 for omitting or skipping pre-verification with respect to some or all data sectors. The comparator circuit 5 executes pre-verification of only the sectors associated with deactivated one(s) of the write history flags within the write history flag buffer 14, while omitting pre-verification of the sectors associated with the activated one(s). When four of the write history flags are respectively set to logic "0", "1", "1", and "1" as shown in FIG. 6, for example, the pre-verification is executed only with respect to the data sector associated with the deactivated one of the write history flag, that is, the one set to logic "0", while the pre-verification of the other data sectors are omitted.

As thus-described, the flash memory in this embodiment executes the pre-verification in response to the verify flags and the write history to thereby reduce the write access time. When one of the verify flags is deactivated, the flash memory skips the pre-verification with respect to the page(s) associated with the deactivated verify flag. When another of the verify flags is activated, on the other hand, the flash memory executes the pre-verification with respect to the associated page; however, the flash memory does not execute pre-verification with respect to all the data sectors within the page during the pre-verification with respect to the page. The flash memory omits the pre-verification with respect to the sector(s) associated with the deactivated one(s) of the write history flags. In this way, the pre-verification of part or whole of the write data is skipped. This effectively reduces the write access time.

Figure 7:
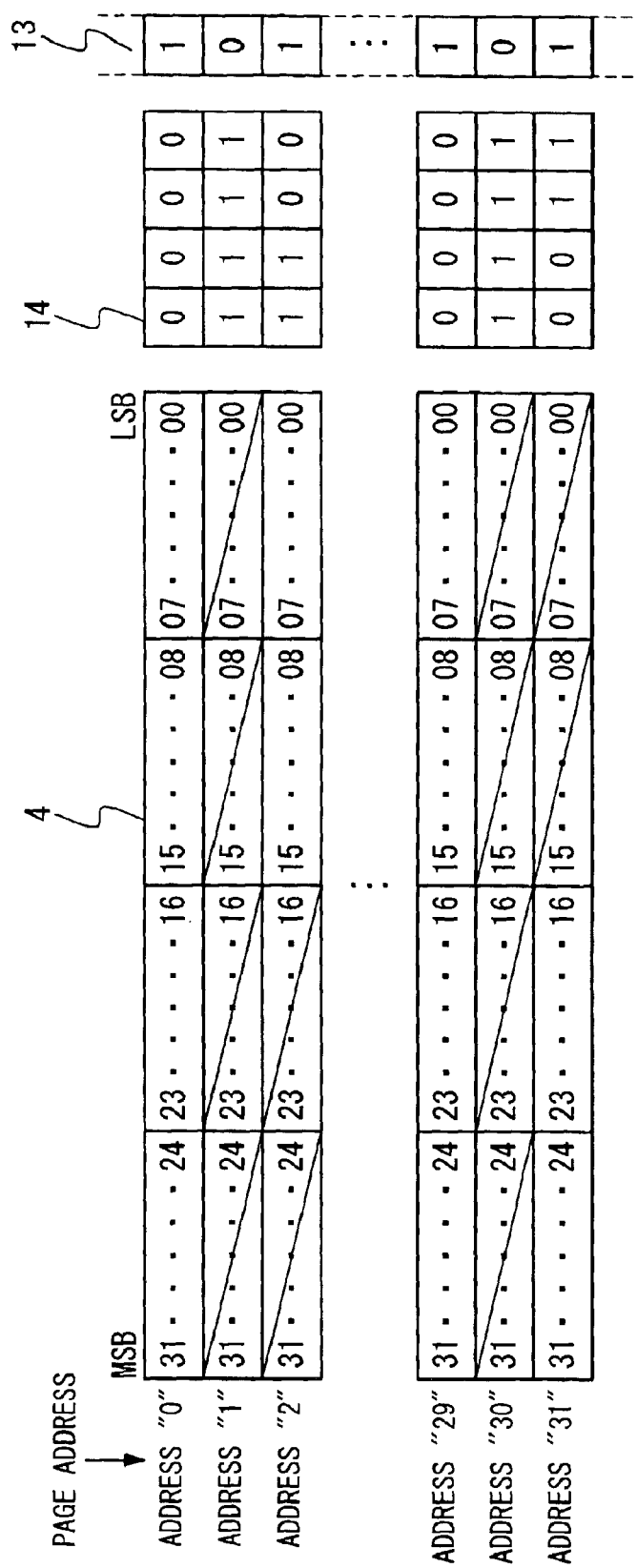
FIG. 7 illustrates pre-verification of write data stored in a page buffer in response to verify flags and write history flags.

FIG. 7 shows an exemplary procedure of the pre-verification in this embodiment. Shaded areas in the FIG. 7 represent data sectors that does not go through pre-verification. Data within the page identified by the page address "0" goes through pre-verification in response to the activation of the verify flag associated with the page address, and the deactivation of all of the write history flags associated with the page address "0". Data within the page identified by the page address "1" does not go through pre-verification in response to the deactivation of the verify flag associated with the page address "1". With respect to the page address "2", data within a first data sector containing bits "00" through "07" and a second data sector containing bits "08" through "15" goes through pre-verification in response to the activation of the verify flag associated with the page address "2" and the deactivation of the write history flags associated with the first and second sectors, while the data within a third data sector containing bits "16" through "23" and a second data sector containing bits "24" through "31" does not go through pre-verification in response to the activation of the write history flags associated with the third and fourth sectors.

Figure 9:
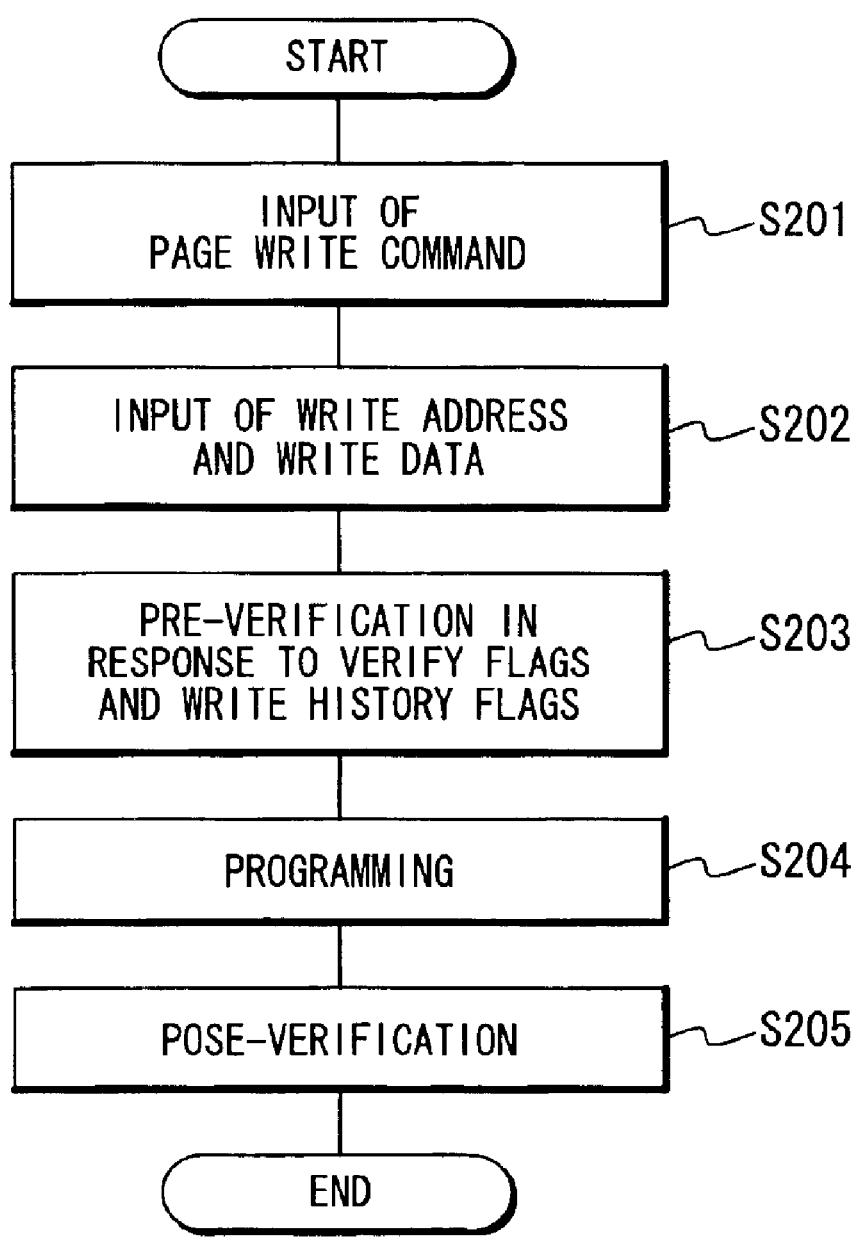
FIG. 9 is a flowchart illustrating operations of the flash memory in accordance with the present invention.

FIG. 9 is a flow chart illustrating the procedure of write operation in this embodiment.

The procedure begins with an input of a page write command. In response to the page write command, the page buffer 4, the verify flag buffer 13 and the write history flag 14 are initialized at Step 201. All the data bits within the page buffer 4 are activated (or set to logic "1"), all the write history flags within the write history flag buffer 14 are activated (or set to logic "1"), and all the verify flags within the verify flag buffer 13 are deactivated (or set to logic "0").

The initialization is followed by reception of a write address and a write data through the address buffer 1 and the I/O buffer 2 at Step 202. The received write data is within the page buffer 4. It should be noted that the pages and the data sectors within the page buffer 4 are addressable by the write address (which includes the page address and the sector address), and some of the pages and the data sectors are accessed, while the others are not accessed. The write history flag buffer 14 switches the write history flag(s) associated with the accessed data sector(s) from logic "1" to logic "0" in response to the page address and the sector address. In the meantime, the verify flag buffer 13 switches the verify flag(s) associated with the accessed page from logic "0" to logic "1" in response to the page address.

The data within the page buffer 4 is then compared by the comparator circuit 5 with the data stored in the addressed block of the memory cell array 8 to achieve pre-verification in response to the verify flags and the write history flags.

In response to the deactivation of the verify flag associated with the addressed page, the sequence controller 12 controls the internal address generator 11 to skip the pre-verification of the page associated with the deactivated verify flag. In detail, the sequence controller 12 outputs a control signal to allow the internal address generator 11 to increment the internal address immediately after the previous increment of the internal address when the verify flag associated with the addressed page is deactivated. This avoids the pre-verification the addressed page within the page buffer 4.

When the associated verify flag is activated, on the other hand, the comparator circuit 5 receives the write history flags associated with the addressed page from the write history flag buffer 14, and executes the pre-verification of the addressed page in response to the received write history flags. When one or more of the received write history flags are activated, the comparator 5 skips pre-verification the data within the data sector(s) associated with the activated write history flag(s), and deactivates the associated signal bits within the write enable signal 21 and the write error detection signal 20, regardless of the data of the associated data sector. Referring back to FIG. 7, consider the case of the page identified by the page address "31". With respect to the page address "31", the comparator circuit 5 skips the pre-verification of the data within the first and second data sectors, respectively containing bits "00" through "07" and bits "08" through "15", in response to the activation of the associated write history flags. In response to the deactivation of the associated write history flags, on the other hand, the comparator circuit 5 executes the pre-verification of the data within the third and fourth data sectors, respectively containing bits "16" through "23" and bits "24" through "31", and deactivates the associated signal bits of the write enable signal 21 and the write error detection signal 20.

In response to the result of the pre-verification at Step 203, programming of the memory cell array 8 is then executed at Step 204 to write the write data, which is temporary stored in the page buffer 4, into the memory cell array 8. When the write data is identical to the data within the addressed location of the memory cell array 8, the data write is cancelled. When the write data includes one or more bits which require flip of data from logic "0" to logic "1" within the addressed block of the memory cell array 8, the write data is programmed into the addressed block after the addressed block is erased; otherwise, the write data is programmed without erasing the addressed block.

Finally, post-verification is executed at Step 205 to confirm that the write data is correctly written into the addressed block of the memory cell array 8 by comparing the data stored in the addressed block with the data stored in the page buffer 4.

As mentioned above, the flash memory in this embodiment effectively reduces the write access time by skipping the unnecessary pre-verification of the unupdated pages in response to the verify flags.

Figure 8A:
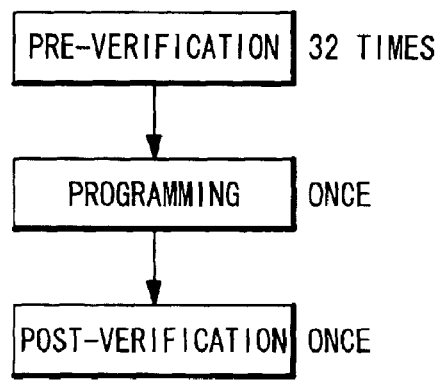
FIGS. 8A and 8B illustrate improvement of write access time.
Figure 8B:
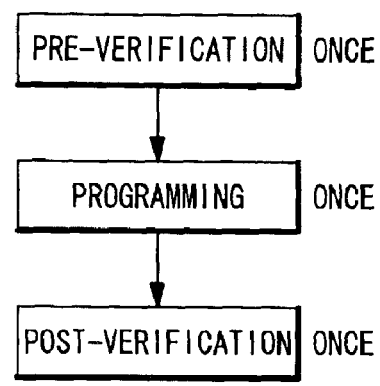

FIGS. 8A and 8B depicts reduction of the write access time by skipping the unnecessary pre-verification of the unupdated pages in this embodiment. Duration of data verification of one page is assumed to be 0.2 μs, and duration of programming the memory cell array 8 is assumed to be 10 μs. Even if only one of the pages is updated, the conventional flash memory shown in FIG. 1 executes pre-verification of all the pages within the page buffer 4. The pre-verification is followed by the programming and the post-verification of the updated page. Therefore, the write access time of the conventional flash memory is 16.6 μs (=0.2*{32+1}+10*1).

On the other hand, the flash memory in this embodiment executes pre-verification of only the updated page. Therefore, the write access time is reduced to 10.4 μs (=0.2*{1+1}+10*1).

As can be understood from FIGS. 8A and 8B, the flash memory in this embodiment effectively reduces the write access time by omitting or skipping the unnecessary pre-verification of the unupdated page(s).

Correspondingly, the flash memory in this embodiment effectively reduces the write access time by skipping the unnecessary pre-verification of the unupdated data sector(s) in response to the write history flags.

Furthermore, the provision of a plurality of the write history flags for each page allows the data width of the flash memory to be different from the number of the data bits of each page. In this embodiment, the data width is allowed to be any of 8 bits, 16 bits, and 32 bits.

Such architecture that a plurality of write history flags are provided for each page effectively reduces write access time when the data width is smaller than the number of data bits of each page. When the flash memory is placed into the 8-bit data input mode, the data width is set to 8 bits, that is, 8-bit write data is inputted at one time. This often results in that only 8 bits is updated within a page, that is, only one data section is updated within the associated page. In this case, the pre-verification of the whole of the page is unnecessary. Providing the write history flags within the write history flags 14 allows the flash memory to omit or skip the pre-verification of the unupdated data sectors, and thus effectively reduces the write access time.

In an alternative embodiment, the page buffer 4, and the write history flag buffer 14 are advantageously integrated in the same memory cell array. Since the page buffer 4, and the write history flag buffer 14 are addressable by the same addresses including the page address, the sector address and the internal address, this architecture allows a single row decoder to select a desired row of both of the page buffer 4 and the write history flag buffer 14, while a single column decoder to select a desired column of both of the page buffer 4 and the write history flag buffer 14. Therefore, the integration of the page buffer 4, and the write history flag buffer 14 into the same memory cell array effectively improves simplicity of the flash memory structure.

Although the invention has been described in its preferred form with a certain degree of particularity, it is understood that the present disclosure of the preferred form has been changed in the details of construction and the combination and arrangement of parts may be resorted to without departing from the scope of the invention as hereinafter claimed.

Especially, it should be also noted that one skilled in the art would appreciate that the maximum data width of the flash memory is not limited to 32 bits.

Furthermore, one skilled in the art would appreciate that the verify flags and the write history flags may be positive or negative logic. When the activation of the verify flags designates switching them from logic "1" to logic "0", the deactivation thereof designates switching them from logic "0" to logic "1", and vice versa. Correspondingly, when the activation of the write history flags designates switching them from logic "1" to logic "0", the deactivation thereof designates switching them from logic "0" to logic "1", and vice versa.

What is claimed is:

1. A flash memory comprising:

a flash memory cell array including a plurality of blocks;

a page buffer including a plurality of pages, wherein said page buffer temporarily stores therein write data received from an external system;

a comparator circuit executing pre-verification through comparing data stored in said page buffer with data stored in addressed one of said plurality of blocks;

a verify flag buffer storing therein a plurality of verify flags respectively associated with said plurality of pages, wherein each of said plurality of verify flags is switched in response to update of associated one of said plurality of pages, and wherein said comparator circuit executes pre-verification with respect to one of said pages, said one being associated with unswitched one of said verify flags, while skipping pre-verification with respect to another of said pages associated with said switched one of said verify flags.

2. The flash memory according to claim 1, further comprising a write history flag buffer, wherein each of said pages within said page buffer includes a plurality of data sectors, wherein said write history flag buffer stores therein a plurality of write history flags respectively associated with plurality of said data sectors, each of said plurality of write history flags being switched in response to rewrite of associated one of said plurality of pages, and wherein said comparator circuit executes pre-verification with respect to one of said data sectors associated with unswitched one of write history flags, while skipping pre-verification with respect to another of said data sectors associated with said switched one of said write history flags.

3. The flash memory according to claim 1, wherein said page buffer, and said write history buffer are integrated in the same memory cell array.

4. A method of operating a flash memory which includes a flash memory cell array having a plurality of blocks, a page buffer including a plurality of pages, and a verify flag buffer storing therein a plurality of verify flags respectively associated with said pages, said method comprising:

storing write data into said page buffer including a plurality of pages;

switching one(s) of said plurality of verify flags in response to update of associated one(s) of said plurality of pages during said storing; and executing pre-verification through comparing data within said page buffer with data stored in addressed one of said plurality of blocks, wherein said executing pre-verification includes:

executing pre-verification with respect to one of said pages, said one being associated with unswitched one of said plurality of verify flags, and skipping pre-verification with respect to another of said pages associated with said switched one of said verify flags.

5. The method according to claim 4, wherein each of said pages includes a plurality of data sectors, and said flash memory further includes a write history flag buffer storing therein a plurality of write history flags respectively associated with said data sectors, wherein said method further comprising:

switching one(s) of said plurality of write history flags in response to update of associated one(s) of said plurality of data sectors during said storing, and wherein said executing pre-verification with respect to said one of said pages includes:

executing pre-verification with respect to one of said data sectors associated with unswitched one of said plurality of write history flags, skipping pre-verification with respect to another of said data sectors associated with said switched one of said write history flags.

* * * * *